United States Patent [19]

Yoshimura et al.

[11] Patent Number: 4,499,217

[45] Date of Patent: Feb. 12, 1985

[54] THERMO-SETTING RESINOUS LIQUID COMPOSITIONS

[75] Inventors: Masaru Yoshimura; Sumio Saitoh, both of Yokohama, Japan

[73] Assignee: Catalysts & Chemicals Industries, Co. Ltd., Tokyo, Japan

[21] Appl. No.: 343,920

[22] Filed: Jan. 29, 1982

[30] Foreign Application Priority Data

Feb. 2, 1981 [JP] Japan .................................. 56-14165

[51] Int. Cl.$^3$ ...................... C08L 33/00; C08L 63/00; C08L 75/04; C08L 83/00
[52] U.S. Cl. .............................. 523/456; 523/333; 523/466; 524/379; 524/391; 524/492; 524/493; 524/588; 525/475; 525/477; 528/106
[58] Field of Search ............... 524/391, 379, 492, 493, 524/588; 523/333, 456, 466; 525/475, 477; 528/106

[56] References Cited

U.S. PATENT DOCUMENTS

| | | | |
|---|---|---|---|
| 2,467,340 | 4/1949 | Seymour | 524/379 |
| 2,753,316 | 7/1956 | Campbell | 524/379 |
| 2,858,284 | 10/1958 | Acker et al. | 524/379 |
| 3,415,771 | 12/1968 | Woodruff | 524/379 |
| 3,476,827 | 11/1969 | Engelhardt | 524/503 |
| 3,652,379 | 3/1972 | White et al. | 428/446 |
| 4,107,140 | 8/1978 | Blount | 521/154 |
| 4,113,693 | 9/1978 | Blount | 528/271 |
| 4,125,703 | 11/1978 | Blount | 528/95 |
| 4,142,030 | 2/1979 | Dieterich et al. | 521/100 |
| 4,174,331 | 11/1979 | Myles | 524/379 |
| 4,185,002 | 1/1980 | Nakamura et al. | 524/379 |
| 4,322,468 | 3/1982 | Raghava | 428/204 |

FOREIGN PATENT DOCUMENTS 1478474 6/1977 United Kingdom .

OTHER PUBLICATIONS

Derwent Abst. 47368 D/26 Sadomskii (Su-770641), (Oct. 1980).

Derwent Abst. 74578 D/41 Asahi Glass (J56106969), (Aug. 1981).

*Primary Examiner*—Ronald W. Griffin
*Attorney, Agent, or Firm*—Murray, Whisenhunt & Ferguson

[57] ABSTRACT

A liquid composition comprising a dispersion of silica colloid in alcohol and a thermo-setting resin. The dry film of this composition is superior in chemical resistance, surface hardness, abrasion resistance, heat resistance and adhesiveness to a substrate.

2 Claims, No Drawings

THERMO-SETTING RESINOUS LIQUID COMPOSITIONS

BACKGROUND OF THE INVENTION

The present invention relates to a liquid composition comprising a dispersion of silica colloid in alcohol and a thermo-setting resin.

Compositions compounded with large quantities of inorganic substances such as calcium carbonate, clay, talc, mica, etc., as fillers are widely known. However, these fillers may rather be said to have been mixed merely for the purpose of reducing the cost.

The liquid composition of the present invention, which comprises a mixture of a dispersion of silica colloid in alcohol and a thermo-setting resin, has been found to exhibit, when hardened at room temperature or by heating, an excellent efficiency utterly different from the conventional thermo-setting resin compositions compounded with inorganic fillers. In other words, the film made from the liquid composition of the present invention has been found to exhibit improved properties such as chemical resistance, surface hardness, abrasion resistance, adhesiveness, heat resistance, etc. These improved properties are considered attributable to the formation of a composite comprising an active silanol on the surfaces of silica fine particles and a thermo-setting resin.

SUMMARY OF THE INVENTION

The present invention provides a liquid composition comprising a dispersion of silica colloid in alcohol and a thermosetting resin. The solid content of this liquid composition preferably comprises 1 to 80 wt.% of silica and 99 to 20 wt.% of a thermo-setting resin.

DETAILED DESCRIPTION OF THE PREFERRED EMBODIMENTS

As the thermo-setting referred to in the present invention there may be used any polymer containing, in the polymer chain and/or terminal, at least one of a hydroxyl group (including a phenol type hydroxyl group and its alkylether group), a carboxyl group, an epoxy group, an amino group, an acid anhydride group (—CO—O—OC—), an isocyanate group and a silanol group. In the concrete, as the thermo-setting resin there can be enumerated acrylic, acryl-melamine, acryl-epoxy, acryl-urethane, melamine-alkyd, epoxy, epoxy-phenolic, phenolic or silicone resin. These resins are easy to obtain commercially.

The dispersion of silica colloid in alcohol used in the present invention is prepared by using a lower alcohol as the dispersion medium an aqueous silica sol in place of water. This aqueous silica sol is a stable colloidal liquid wherein gelation of colloid has been prevented by the steps of producing silica colloid by neutralizing a dilute aqueous solution of sodium silicate with an acid, then growing colloidal particles to have a diameter of 10 to 50 mµ while condensing the liquid and thereafter controlling the pH of the liquid. The aqueous silica sols of this sort are commercially available in the trade names, for instance, Cataloid (a produced of Catalysts & Chemicals Industries Co., Ltd.), Snowtex (a product of Nissan Kogaku Kogyo K.K.), Ludox (a product of Du Pont Co.), etc.

The substitution of the dispersion medium can be effected by adding the lower alcohol to the aqueous silica sol and distilling water out by means of distillation or the like. The lower alcohol used herein includes methanol, ethanol, propanol and butanol. The silica concentration of the alcohol dispersion may be selected optionally, but preferably is in the range of 1 to 50 wt.%.

As the aqueous silica sol is a water dispersion, its usage has usually been restricted to the so-called water system, for instance, such as prevention of sliding for paper articles, shell molds for precision metal casting, inorganic binders for various refractory bodies, adhesion improver and reinforcing agent for latex coating, etc. In contrast, the present invention uses the silica colloid in the form of an alcohol dispersion and thus permits the formation a composite comprising the silica colloid and the thermo-setting resin. Due to this, the hardened product of this liquid composition can exhibit exceedingly improved chemical resistance, surface hardness, abrasion resistance, adhesiveness, and heat resistance.

The liquid composition of the present invention is further added with a filler, a coloring agent and various additives, and thus can be used for various purposes, for instance, such as primers, coating, lining, inking, adhesives, sealing agents, casting or various treating agents and impregnant.

Hereinafter, the present invention will be explained more concretely with reference to examples.

EXAMPLE 1

A dispersion of the silica colloid in isopropyl alcohol (N.V.=30%, which will be referred to IPA-silica hereinafter) was added to melamine-alkyd resin [Beckosol J-541-50: a product of Dainippon Ink and Chemicals, Inc.]. The resulting mixture was applied onto a degreased, cold rolled steel sheet (SPCC-SD), and same was baked at 120° C. for 20 minutes. The physical properties of the coating film thus obtained are as shown in Table 1.

TABLE 1

| No. | Silica[a] (wt. %) | Appearance of mixture | Appearance of coating film | Resistance to[b] methylene chloride | Pencil hardness | Adhesiveness[c] |
|---|---|---|---|---|---|---|
| 1 | 0 | transparent solution | colorless, transparent | failed in the first test | 3H | 100/100 |
| 2 | 29 | transparent solution | colorless, transparent | failed in the 7th test | 5H | " |
| 3 | 38 | transparent solution | colorless, transparent | passed 10 tests | 6H | " |
| 4 | 44 | transparent solution | colorless, transparent | passed 10 tests | 6H | " |

[a]Silica content (wt. %) of the final solid coating film.
[b]Spot test.
[c]Adhesiveness: Checkerboard test.

EXAMPLE 2

The exactly same tests as Example 1 were repeated except that IPA-silica was added to an oil-free type melamine-alkyd resin (Beckliht M-6003-60: a product of Dainippon Ink and Chemicals, Inc.) and the resulting mixture was baked at 110° C. for 30 minutes. The obtained results are as shown in Table 2.

TABLE 2

| No. | Silica (wt. %) | Appearance of mixture | Appearance of coating film | Resistance to methyl ethyl ketone | Pencil hardness | Adhesiveness |
|---|---|---|---|---|---|---|
| 1 | 0 | transparent solution | transparent | failed in the first test | F | 100/100 |
| 2 | 30 | transparent solution | slightly milky | failed in the 6th test | H | " |
| 3 | 40 | transparent solution | slightly milky | failed in the 6th test | 2H | " |

EXAMPLE 3

The exactly same tests as Example 1 were repeated except that IPA-silica was added to an acrylmelamine resin (Aclose #6000 Clear, NV=50%: a product of Dai Nippon Toryo Co., Ltd.) and the resulting mixture was baked at 150° C. for 20 minutes. The obtained results are as shown in Table 3.

TABLE 3

| No. | Silica (wt. %) | Appearance of coating film | Resistance to Methylene chloride | Pencil hardness | Adhesiveness | Abrasion[a] (mg) |
|---|---|---|---|---|---|---|
| 1 | 0 | transparent | failed in the first test | 2H | 100/100 | 11.4 |
| 2 | 30 | " | failed in the 8th test | 5H | " | 2.9 |
| 3 | 40 | slightly milky | failed in the 8th test | 6H | " | 2.8 |

[a] Abrasion wear: Determined by a usual method with a Taber machine under conditions comprising a load of 500 g, rotation rate of 200 and truck wheel CS-17.

EXAMPLE 4

IPA-silica was added to an acryl-epoxy resin (main component: acrylic resin, hardening agent: epoxy resin, mixing ratio of the main component to the hardening agent=10/1 by weight: a product of Ohashi Chemical Industries Co., Ltd.). The resulting mixture was applied onto a degreased polymethyl methacrylate plate (PMMA) and sheet-molding compound plate (SMC) and same was baked at 80° C. for 30 minutes. The physical properties of the coating film thus obtained are as shown in Table 4.

TABLE 4

| No. | Silica (wt. %) | Appearance of coating film | Resistance to toluene | Pencil hardness | Adhesiveness[a] (a) | Adhesiveness[b] (b) |
|---|---|---|---|---|---|---|
| 1 | 0 | transparent | failed in the first test | 2H | 100/100 | 20/100 |
| 2 | 35 | " | passed the tenth test | 4H | " | 100/100 |
| 3 | 47 | " | passed the tenth test | 5H | " | " |
| 4 | 52 | " | passed the tenth test | 5H | " | " |

[a] Adhesiveness (a): Adhered PMMA
[b] Adhesiveness (b): Adhered SMC

EXAMPLE 5

IPA-silica was added to an acryl-urethane resin (main component: Orester Q602, hardening agent: Orester P49-75S: a product of Mitsui Toatsu Chemicals, Inc.). The resulting mixture was applied onto a degreased PMMA plate and same was baked at 80° C. for 30 minutes. The physical properties of the coating film thus obtained are as shown in Table 5.

TABLE 5

| No. | Silica (wt. %) | Appearance of coating film | Resistance to toluene | Pencil hardness | Adhesiveness |
|---|---|---|---|---|---|
| 1 | 0 | transparent | failed in the first test | H | 100/100 |
| 2 | 34 | " | failed in the 5th test | 3H | " |
| 3 | 46 | " | failed in the 8th test | 4H | " |
| 4 | 51 | " | passed the 10th test | 4H | " |

EXAMPLE 6

IPA-silica was added to 100% acrylic resin (Duracron CW Clear: a product of Dai Nippon Toryo Co., Ltd.). The resulting mixture was applied onto a degreased aluminum plate and same was baked at 180° C. for 30 minutes. The physical properties of the coating film thus obtained are as shown in Table 6.

TABLE 6

| No. | Silica (wt. %) | Appearance of coating film | Resistance to toluene | Pencil hardness | Adhesiveness |
|---|---|---|---|---|---|
| 1 | 0 | transparent | passed the tenth test | 2H | 100/100 |
| 2 | 10 | " | passed the tenth test | 3H | " |
| 3 | 20 | " | passed the tenth test | 3H | " |
| 4 | 30 | " | passed the tenth test | 3H | " |

EXAMPLE 7

IPA-silica was added to an epoxy resin (Eponics #1100 Clear: a product of Dai Nippon Toryo Co., Ltd.). The resulting mixture was applied onto a degreased, cold rolled steel sheet and same was baked at 180° C. for 30 minutes. The physical properties of the coating film thus obtained are as shown in Table 7.

TABLE 7

| No. | Silica (wt. %) | Appearance of coating film | Resistance to methylene chloride | Pencil hardness | Adhesiveness | Abrasion[a] wear (mg) |
|---|---|---|---|---|---|---|
| 1 | 0 | transparent | passed the tenth test | 5H | 100/100 | 2.2 |
| 2 | 20 | " | passed the tenth test | 6H | " | 0.8 |
| 3 | 30 | " | passed the tenth test | 7H | " | — |
| 4 | 40 | " | passed the tenth test | 9H | " | 0.8 |

[a]Abrasion wear: Load: 500 g, rotation: 200, truck wheel CS-17.

EXAMPLE 8

IPA-silica was added to a phenolic resin (a product of Dai Nippon Ink and Chemicalsl, Inc.). The resulting mixture was applied onto a degreased, cold rolled steel sheet and same was baked at 190° to 200° C. for 30 minutes. The physical properties of the coating film thus obtained are as shown in Table 8.

TABLE 8

| No. | Phenolic resin | Silica (wt. %) | Appearance of coating film | Resistance to methylene chloride | Pencil hardness | Adhesiveness | Abrasion[a] wear (mg) |
|---|---|---|---|---|---|---|---|
| 1 | | 0 | brown, transparent | passed the tenth test | 6H | 100/100 | — |
| 2 | Plyophen 5010 | 20 | light brown, transparent | passed the tenth test | 7H | " | — |
| 3 | | 40 | light brown, transparent | passed the tenth test | 8H | " | — |
| 4 | | 0 | brown, transparent | passed the tenth test | 7H | " | 12.2 |
| 5 | Plyophen TD 447 | 20 | light brown, transparent | passed the tenth test | 8H | " | — |
| 6 | | 40 | light brown, transparent | passed the tenth test | 9H | " | 9.5 |

[a]Abrasion wear: 500 g load, 1000 rotations, truck wheel CS-17.

EXAMPLE 9

IPA-silica was added to an epoxy-phenolic resin, and then the same test as used in Example 8 was repeated thereon. The obtained results are as shown in Table 9, wherein as the epoxy-phenolic resin there were used 20 parts of "Plyophen TD447" and 20 parts of "Epikot 1007" (a product of Shell Chemical Co.) diluted with methyl isobutyl ketone.

TABLE 9

| No. | Silica (wt. %) | Appearance of coating film | Resistance to methylene chloride | Pencil hardness | Adhesiveness |
|---|---|---|---|---|---|
| 1 | 0 | transparent | passed the tenth test | 3H | 100/100 |
| 2 | 10 | " | passed the tenth test | 4H | " |
| 3 | 20 | " | passed the tenth test | 4H | " |
| 4 | 40 | slightly milky | passed the tenth test | 4H | " |

EXAMPLE 10

IPA-silica was added to a silicone resin. The resulting mixture was applied onto a degreased glass plate and same was baked at 180° C. for 60 minutes. The physical properties of the coating film thus obtained are as shown in Table 10.

TABLE 10

| No. | Silicon resin | Silica content (wt. %) | Appearance of coating film | Resistance to toluene | Pencil hardness | Adhesiveness |
|---|---|---|---|---|---|---|
| 1 | Tore silicone SH 806[a] | 0 | transparent | failed in the first test | B | 50/100 |
| 2 | | 10 | slightly milky | failed in the third test | F | 100/100 |
| 3 | | 20 | milky | failed in the third test | F | " |
| 4 | Tore silicone | 0 | transparent and crack | adhesive | B | 0/100 |

TABLE 10-continued

| No. | Silicon resin | Silica content (wt. %) | Appearance of coating film | Resistance to toluene | Pencil hardness | Adhesiveness |
|---|---|---|---|---|---|---|
| | SH 6018[b] | | observed | | | |
| 5 | | 10 | slightly milky | slightly adhesive | F | 80/100 |
| 6 | | 20 | slightly milky and crack observed | slightly adhesive | F | 50/100 |

[a]NV = 50% Solvent: toluene/xylene
[b]Powder solid. Mean molecular weight = 1600(The powder solid was used in the manner of diluting it with diacetone alcohol so that NV is equal to 50%.)

We claim:

1. An essentially water-free liquid composition comprising a composite formed from (a) an essntially water-free dispersion of silica colloid in alcohol, said silica having particle diameter of between about 10 and 50 mµ, and (b) a thermo-setting resin selected from the group consisting of acrylic, acryl-melamine, acryl-epoxy, acryl-urethane, melamine-alkyd, epoxy, epoxy-phenolic, phenolic and silicone resins.

2. A liquid composition according to claim 1 wherein the quantity of said silica present in the solid content of said composition is 1 to 80 wt.% and the quantity of said thermosetting resin present therein is 99 to 20 wt.%.

* * * * *